United States Patent
Uejima (10) Patent No.: US 10,383,210 B2
(45) Date of Patent: Aug. 13, 2019

(54) HIGH-FREQUENCY MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/125,886

(22) Filed: Sep. 10, 2018

(65) Prior Publication Data

US 2019/0008032 A1 Jan. 3, 2019

Related U.S. Application Data

(63) Continuation of application No. PCT/JP2017/008872, filed on Mar. 7, 2017.

(30) Foreign Application Priority Data

Mar. 31, 2016 (JP) .................................. 2016-070550

(51) Int. Cl.
*H05K 1/02* (2006.01)
*H04B 1/525* (2015.01)
(Continued)

(52) U.S. Cl.
CPC ......... *H05K 1/0216* (2013.01); *H01L 23/552* (2013.01); *H03H 7/38* (2013.01); *H04B 1/0475* (2013.01); *H04B 1/525* (2013.01); *H05K 1/0231* (2013.01); *H05K 1/0233* (2013.01); *H05K 1/181* (2013.01); *H05K 9/0022* (2013.01); *H01L 23/3121* (2013.01); *H01L 2223/6655* (2013.01); *H01L 2224/16227* (2013.01);
(Continued)

(58) Field of Classification Search
CPC .. H05K 1/0216; H05K 1/0231; H05K 1/0233; H01L 23/552; H03H 7/38; H04B 1/0475; H04B 1/525
USPC .......................................................... 361/760
See application file for complete search history.

(56) References Cited

U.S. PATENT DOCUMENTS

| | | | | |
|---|---|---|---|---|
| 5,382,929 A | * | 1/1995 | Inao | ............ H03H 9/02133 310/344 |
| 2006/0028298 A1 | * | 2/2006 | Nakamura | ............ H03H 9/0038 333/133 |
| 2010/0244979 A1 | | 9/2010 | Matsuda et al. | |

FOREIGN PATENT DOCUMENTS

| JP | 10-107471 A | 4/1998 |
|---|---|---|
| JP | 2008-078321 A | 4/2008 |
| JP | 5183459 B2 | 4/2013 |

OTHER PUBLICATIONS

Official Communication issued in International Patent Application No. PCT/JP2017/008872, dated May 30, 2017.

* cited by examiner

*Primary Examiner* — Tremesha S Willis
(74) *Attorney, Agent, or Firm* — Keating & Bennett, LLP (57) ABSTRACT

A high-frequency module includes a branching circuit element, a multilayer substrate, and a shield conductor. The branching circuit element includes transmission and receiving terminals and is disposed on a surface of the multilayer substrate. The shield conductor is disposed on the side of the surface of the multilayer substrate and covers the branching circuit element. The transmission and receiving terminals are disposed with respect to the shield conductor such that a signal in at least a portion of the frequency band of a first signal, which is transmitted from the transmission terminal, is cancelled by a second signal at the receiving terminal.

20 Claims, 9 Drawing Sheets

(51) Int. Cl.
*H03H 7/38* (2006.01)
*H04B 1/04* (2006.01)
*H05K 1/18* (2006.01)
*H05K 9/00* (2006.01)
*H01L 23/552* (2006.01)
*H01L 23/31* (2006.01)

(52) U.S. Cl.
CPC ............... *H01L 2924/15313* (2013.01); *H01L 2924/19041* (2013.01); *H01L 2924/19105* (2013.01); *H01L 2924/3025* (2013.01); *H05K 2201/0715* (2013.01); *H05K 2201/0723* (2013.01); *H05K 2201/0919* (2013.01); *H05K 2201/1006* (2013.01)

$\theta_{StxC1}(212) = (180° + \theta_{StxL}(212))$

FIG. 3

$\theta_{StxC1}(212) = (180° + \theta_{StxL}(212))$

$$\theta_{StxC2}(212) = (180° + \theta_{StxL}(212))$$

FIG. 6

$$\theta_{StxC3}(212) = (180° + \theta_{StxL}(212))$$

$\theta_{StxC4}(212) = (180° + \theta_{StxL}(212))$

FIG. 9

$\theta_{StxC5}(213D) = (180° + \theta_{StxH}(213D))$

FIG. 10

$\theta_{StxC5}(213D) = (180° + \theta_{StxH}(213D))$

FIG. 11

$\theta_{StxC6}(213) = (180° + \theta_{StxH}(213))$

FIG. 12

$\theta_{StxC6}(213) = (180° + \theta_{StxH}(213))$

HIGH-FREQUENCY MODULE

CROSS REFERENCE TO RELATED APPLICATIONS

This application claims the benefit of priority to Japanese Patent Application No. 2016-070550 filed on Mar. 31, 2016 and is a Continuation Application of PCT Application No. PCT/JP2017/008872 filed on Mar. 7, 2017. The entire contents of each application are hereby incorporated herein by reference.

BACKGROUND OF THE INVENTION

1. Field of the Invention

The present invention relates to a high-frequency module including a multilayer substrate at which a conductive pattern is provided and a surface mount element disposed on the surface of the multilayer substrate.

2. Description of the Related Art

Japanese Patent No. 5183459 discloses a branching circuit including a transmission filter and a receiving filter. The transmission filter is connected between a transmission terminal and an antenna terminal. The receiving filter is connected between a receiving terminal and the antenna terminal. A transmission signal is input from the transmission terminal, is subjected to filter processing in the transmission filter, and is output from the antenna terminal. The reception signal is input from the antenna terminal, is subjected to filter processing in the receiving filter, and is output from the receiving terminal. Between the antenna terminal and the receiving terminal, a correction capacitor is connected in parallel to the receiving filter.

A portion of the transmission signal output from the transmission filter is transmitted to the receiving terminal via the correction capacitor as a correction signal. By setting a desired capacitance for the correction capacitor, the correction signal is opposite in phase to a leakage signal leaked from the transmission terminal to the receiving terminal. With this configuration, the leakage signal is suppressed by the correction signal and the degree of isolation between the transmission terminal and the receiving terminal is increased.

However, when the branching circuit disclosed in Japanese Patent No. 5183459 is formed with a multilayer substrate and a surface mount filter element mounted on the multilayer substrate, the leakage signal cannot be sufficiently suppressed and a desired degree of isolation between the transmission terminal and the receiving terminal cannot be achieved in some cases.

When a high-frequency module is formed with a multilayer substrate and a surface mount element as in the case of the branching circuit, a desired degree of isolation between a plurality of terminals in a circuit including the surface mount element cannot be achieved in some cases.

SUMMARY OF THE INVENTION

Preferred embodiments of the present invention provide high-frequency modules in each of which isolation between a plurality of terminals in a circuit including a surface mount element is improved.

A high-frequency module according to a preferred embodiment of the present invention includes a surface mount element including a first mounting terminal and a second mounting terminal, a multilayer substrate at which the surface mount element is disposed, and a shield conductor that is disposed on a side of a surface of the multilayer substrate, covers the surface mount element, and is spaced apart from the surface mount element. When a high-frequency signal that passes through between the second mounting terminal and the first mounting terminal is defined as a first signal and a high-frequency signal that transmits from the second mounting terminal to the first mounting terminal via the shield conductor is defined as a second signal, the first mounting terminal and the second mounting terminal are disposed with respect to the shield conductor such that a signal in at least a portion of a frequency band of the first signal is canceled by the second signal at the first mounting terminal.

With this configuration, a signal in at least a portion of the frequency band of the first signal is reduced or prevented by the second signal.

In a high-frequency module according to a preferred embodiment of the present invention, when a phase of a signal in at least a portion of the frequency band of the first signal is defined as $\theta_{StxL}$ and a phase of the second signal is defined as $\theta_{StxC1}$, the first mounting terminal and the second mounting terminal are preferably disposed with respect to the shield conductor such that a difference of the phases is greater than about 90° and less than or equal to about 180°.

With this configuration, a signal in at least a portion of the frequency band of the first signal is more effectively reduced or prevented by the second signal.

In a high-frequency module according to a preferred embodiment of the present invention, the first mounting terminal and the second mounting terminal are preferably capacitively coupled to the shield conductor.

With this configuration, the second signal is transmitted via a capacitor provided by the second mounting terminal and the shield conductor, the shield conductor, and a capacitor provided by the first mounting terminal and the shield conductor and the phase of the second signal is adjusted.

A high-frequency module according to a preferred embodiment of the present invention preferably has the following configuration. The multilayer substrate includes a first internal conductive pattern connected to the shield conductor. The first mounting terminal is capacitively coupled to the shield conductor. The second mounting terminal is capacitively coupled to the first internal conductive pattern.

With this configuration, the second signal is transmitted via a capacitor provided by the second mounting terminal and the first internal conductive pattern, the first internal conductive pattern, the shield conductor, and a capacitor provided by the first mounting terminal and the shield conductor and the phase of the second signal is adjusted.

In a high-frequency module according to a preferred embodiment of the present invention, the first internal conductive pattern is preferably a grounding conductive pattern.

In this configuration, the grounding conductive pattern is used for the transmission path of the second signal.

A high-frequency module according to a preferred embodiment of the present invention is more effective when having the following configuration. The surface mount element is a branching circuit element including a transmission terminal, a receiving terminal, and a common terminal. The second mounting terminal is the transmission terminal. The first mounting terminal is the receiving terminal.

With this configuration, a leakage signal (first signal) leaked from the transmission terminal to the receiving terminal is reduced or prevented by the second signal based on the transmission signal at the receiving terminal.

A high-frequency module according to a preferred embodiment of the present invention may have the following configuration. The surface mount element includes a third mounting terminal that is the common terminal. The surface mount element is disposed on a surface of the multilayer substrate via the third mounting terminal. The multilayer substrate includes a matching circuit element connected to the third mounting terminal. The first mounting terminal and the matching circuit element are capacitively coupled to the shield conductor.

With this configuration, the second signal is transmitted via the matching circuit element, a capacitor provided by the matching circuit element and the shield conductor, the shield conductor, and a capacitor provided by the first mounting terminal and the shield conductor and the phase of the second signal is adjusted.

A high-frequency module according to a preferred embodiment of the present invention includes a surface mount element including a transmission terminal, a receiving terminal, and a common terminal, a multilayer substrate at which the surface mount element is disposed, and a shield conductor that is disposed on a side of a surface of the multilayer substrate, covers the surface mount element, and is spaced apart from the surface mount element. The multilayer substrate includes a matching circuit element connected to the common terminal. A high-frequency signal that is leaked from the transmission terminal to the receiving terminal is defined as a first signal and a high-frequency signal that transmits from the common terminal to the receiving terminal via the matching circuit element and the shield conductor is defined as a second signal. The receiving terminal and the matching circuit element are disposed with respect to the shield conductor such that a signal in at least a portion of a frequency band of the first signal is cancelled by the second signal at the receiving terminal.

With this configuration, a signal in at least a portion of the frequency band of the first signal is reduced or prevented by the second signal.

In a high-frequency module according to a preferred embodiment of the present invention, when a phase of a signal in at least a portion of the frequency band of the first signal is defined as $\theta_{StxL}$ and a phase of the second signal is defined as $\theta_{StxC1}$, the first mounting terminal and the second mounting terminal are preferably disposed with respect to the shield conductor such that a difference of the phases is greater than about 90° and less than or equal to about 180°.

With this configuration, a signal in at least a portion of the frequency band of the first signal is more effectively reduced or prevented by the second signal.

In a high-frequency module according to a preferred embodiment of the present invention, the receiving terminal and the matching circuit element are preferably capacitively coupled to the shield conductor.

With this configuration, the second signal is transmitted via a capacitor provided by the matching circuit element and the shield conductor, the shield conductor, and a capacitor provided by the receiving terminal and the shield conductor.

In a high-frequency module according to a preferred embodiment of the present invention, the matching circuit element may be provided in the multilayer substrate.

With this configuration, the matching circuit element is capacitively coupled to the shield conductor in the multilayer substrate.

In a high-frequency module according to a preferred embodiment of the present invention, the matching circuit element may be disposed on a surface of the multilayer substrate.

With this configuration, the matching circuit element is capacitively coupled to the shield conductor in a region on the side of the surface of the multilayer substrate.

A high-frequency module according to a preferred embodiment of the present invention may have the following configuration. One of side surfaces of the surface mount element which is nearest to the shield conductor is defined as a first side surface. The high-frequency module includes an overlapping portion in which the first side surface and the shield conductor overlap and a non-overlapping portion in which the first side surface and the shield conductor do not overlap when viewed from the first side surface.

With this configuration, a capacitor is provided on the transmission path of the second signal in the shield conductor.

A high-frequency module according to a preferred embodiment of the present invention preferably has the following configuration. When viewed from a front, the overlapping portion includes a first overlapping portion and a second overlapping portion that are separated by the non-overlapping portion. When viewed from the front, a length between the first overlapping portion and the second overlapping portion is shorter than a length of the first side surface.

With this configuration, the mounting terminal of the surface mount element and the shield conductor are easily capacitively coupled.

According to each of preferred embodiments of the present invention, the isolation between a plurality of terminals in a circuit including a surface mount element is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
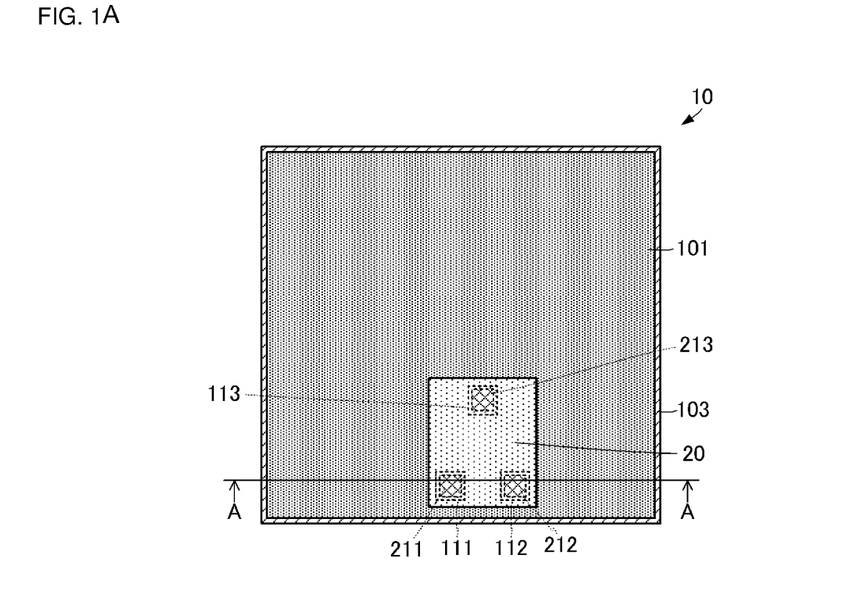
FIG. 1A is a plan view of a high-frequency module according to a first preferred embodiment of the present invention illustrating the main configuration of the high-frequency module.
Figure 1B:
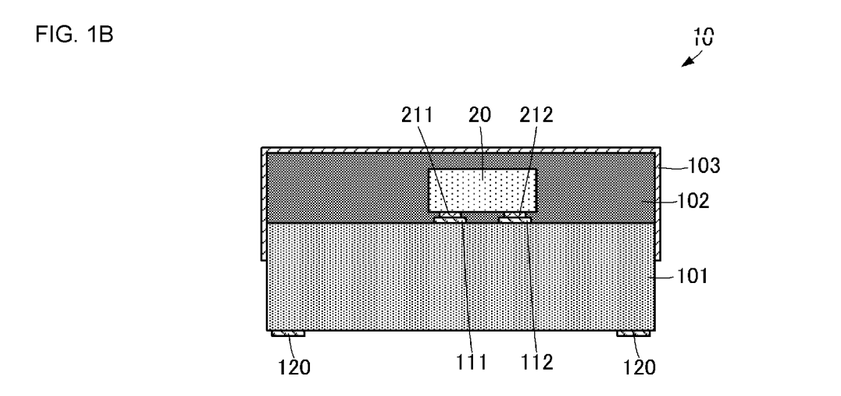
FIG. 1B is a side cross-sectional view of the high-frequency module according to the first preferred embodiment of the present invention illustrating the main configuration of the high-frequency module.
Figure 2:
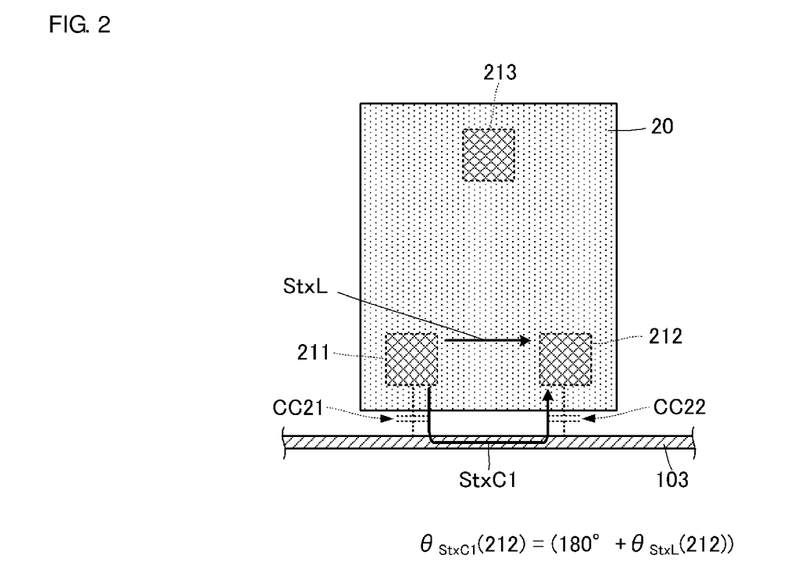
FIG. 2 is an enlarged view of a portion of a high-frequency module in which a branching circuit element is disposed.

High-frequency modules according to preferred embodiments of the present invention will be described with reference to the accompanying drawings. FIG. 1A is a plan view of a high-frequency module according to a first preferred embodiment of the present invention illustrating the main configuration of the high-frequency module. FIG. 1A is a plan view of the high-frequency module in which the top surface portion of a shield conductor and a mold resin are not illustrated. FIG. 1B is a side cross-sectional view of the high-frequency module according to the first preferred embodiment illustrating the main configuration of the high-frequency module. FIG. 1B is a cross-sectional view taken along a line A-A in FIG. 1A. FIG. 2 is an enlarged view of a portion of a high-frequency module in which a branching circuit element is disposed.

As illustrated in FIGS. 1A and 1B, a high-frequency module 10 includes a branching circuit element 20, a multilayer substrate 101, a mold resin 102, and a shield conductor 103. The multilayer substrate 101 includes a plurality of laminated dielectric layers. At the dielectric layers, conductive patterns are provided. With this configuration, a plurality of internal conductive patterns are provided in the multilayer substrate 101.

On the surface of the multilayer substrate 101, land conductors 111, 112, and 113 are provided. The land conductors 111, 112, and 113 are disposed closer to a first side surface of the multilayer substrate 101 than to a second side surface of the multilayer substrate 101. The first side surface and the second side surface face each other. The land conductors 111 and 112 are in the vicinity of the first side surface, and are spaced apart from each other along the first side surface. The land conductor 113 is disposed closer to the second side surface than the land conductors 111 and 112. On the undersurface of the multilayer substrate 101, a plurality of external connection conductors 120 are provided.

In the branching circuit element 20, a conductive pattern with which a branching circuit is defined is provided. On the undersurface of the branching circuit element 20, a transmission terminal 211, a receiving terminal 212, and a common terminal 213 are provided. The transmission terminal 211 corresponds to a "second mounting terminal". The receiving terminal 212 corresponds to a "first mounting terminal".

The transmission terminal 211 and the receiving terminal 212 are in the vicinity of the first side surface of the branching circuit element 20 and are spaced apart from each other along the first side surface. The common terminal 213 is disposed in the vicinity of the second side surface (facing the first side surface) of the branching circuit element 20. That is, the common terminal 213 is farther from the first side surface than the transmission terminal 211 and the receiving terminal 212. The transmission terminal 211 is mounted on (connected to) the land conductor 111. The receiving terminal 212 is mounted on (connected to) the land conductor 112. The common terminal 213 is mounted on (connected to) the land conductor 113.

In this configuration, the first side surface of the branching circuit element 20 is in the vicinity of the first side surface of the multilayer substrate 101 in plan view of the high-frequency module 10. That is, the transmission terminal 211 and the receiving terminal 212 are in the vicinity of the first side surface of the multilayer substrate 101.

The mold resin 102 covers the entire or substantially the entire surface of the multilayer substrate 101 and the branching circuit element 20. Side surfaces of the mold resin 102 are flush or substantially flush with corresponding side surfaces of the multilayer substrate 101. The mold resin 102 is preferably an insulating resin, for example.

The shield conductor 103 includes a top surface portion and four side surface portions. The side surface portions are connected to corresponding sides of the top surface portion. The top surface portion of the shield conductor 103 covers the top surface of the mold resin 102. Each of the four side surface portions covers a corresponding one of four side surfaces of the mold resin 102. The shield conductor 103 is preferably a thin film or a conductor plate, for example. Each of the four side surface portions of the shield conductor 103 also covers a portion of a corresponding one of four side surfaces of the multilayer substrate 101.

In this configuration, as illustrated in FIGS. 1A and 2, the transmission terminal 211 and the receiving terminal 212 of the branching circuit element 20 are in the vicinity of one (hereinafter referred to as a first side surface portion) of the side surface portions of the shield conductor 103. Accordingly, as illustrated in FIG. 2, each of the transmission terminal 211 and the receiving terminal 212 is capacitively coupled to the shield conductor 103. Specifically, the transmission terminal 211 and the shield conductor 103 define a capacitor CC21. The receiving terminal 212 and the shield conductor 103 define a capacitor CC22.

Figure 3:
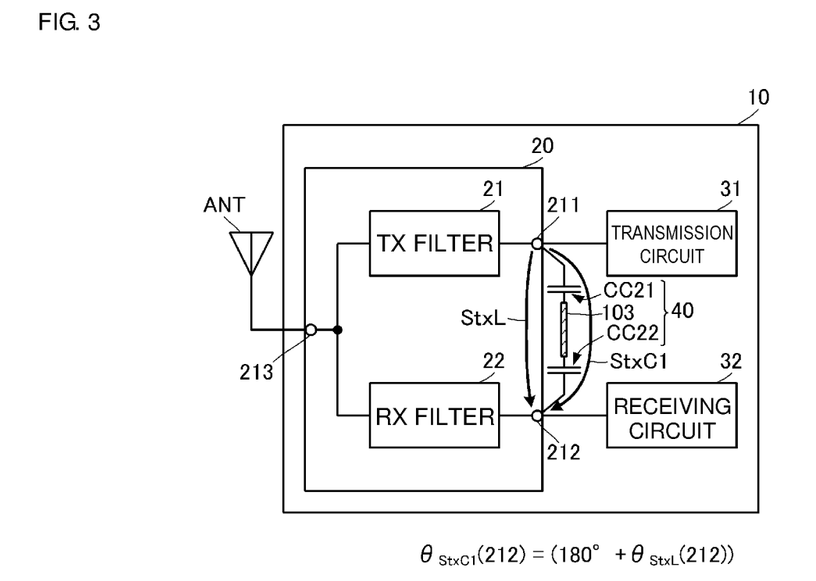
FIG. 3 is a circuit diagram of a high-frequency module according to the first preferred embodiment of the present invention.

The high-frequency module 10 having the above-described configuration provides a circuit illustrated in FIG. 3. FIG. 3 is a circuit diagram of a high-frequency module according to the first preferred embodiment of the present invention.

As illustrated in FIG. 3, the high-frequency module 10 includes the branching circuit element 20, a transmission circuit 31, and a receiving circuit 32. The branching circuit element 20 includes the transmission terminal 211, the receiving terminal 212, and the common terminal 213. The branching circuit element 20 includes a TX filter 21 and an RX filter 22. The TX filter 21 and the RX filter 22 are defined by a conductive pattern in the branching circuit element 20.

The TX filter 21 is connected between the transmission terminal 211 and the common terminal 213. The TX filter 21 has the frequency band of a transmission signal as its passband and a frequency band other than the frequency band of the transmission signal as its attenuation band.

The RX filter 22 is connected between the receiving terminal 212 and the common terminal 213. The RX filter 22 has the frequency band of a reception signal as its passband and a frequency band other than the frequency band of the reception signal as its attenuation band.

The transmission terminal 211 is connected to the transmission circuit 31. The transmission circuit 31 amplifies a transmission signal. The transmission circuit 31 includes a power amplifier PA. Although not illustrated in FIGS. 1A, 1B and 2, the power amplifier PA is preferably, for example, a surface mount element and is disposed on the surface of the multilayer substrate 101 along with the branching circuit element 20.

The receiving terminal 212 is connected to the receiving circuit 32. The receiving circuit 32 amplifies a reception signal. The receiving circuit 32 includes a low noise amplifier LNA. Although not illustrated in FIGS. 1A, 1B and 2, the low noise amplifier LNA is preferably, for example, a surface mount element and is disposed on the surface of the multilayer substrate 101 along with the branching circuit element 20.

In the high-frequency module 10, a portion other than the portion defined by the surface mount elements in the transmission circuit 31 and the receiving circuit 32 and the branching circuit element 20 is defined by the internal conductive pattern in the multilayer substrate 101 and the conductive pattern provided on at least one of the surface and undersurface of the multilayer substrate 101.

The common terminal 213 is connected to an antenna ANT. The antenna ANT is provided at a substrate on which a high-frequency module 10 is disposed.

In the high-frequency module 10, the transmission terminal 211 and the receiving terminal 212 are capacitively coupled to the shield conductor 103 as described above. As a result, the transmission terminal 211 and the receiving terminal 212 are connected by a by-pass circuit 40 that is a series circuit of the capacitor CC21, the shield conductor 103, and the capacitor CC22.

The capacitance of the capacitor CC21 and the capacitance of the capacitor CC22 are determined in accordance with a phase $\theta_{StxL}$ of a first signal StxL that is a transmission signal (high-frequency signal) leaked from the transmission terminal 211 to the receiving terminal 212 and a phase $\theta_{StxC1}$ of a second signal StxC1. The first signal is a transmission signal (high-frequency signal) leaked from the transmission terminal 211 to the receiving terminal 212. The second signal is a high-frequency signal that is a portion of a transmission signal passing through the by-pass circuit 40. Specifically, the capacitances of the capacitors CC21 and CC22 are determined such that the phase $\theta_{StxL}$ (212) of the first signal StxL and the phase $\theta_{StxC1}$ (212) of the second signal StxC1 are opposite to each other ($\theta_{StxC1}$ (212)=(180°+ $\theta_{StxL}$ (212))) at the receiving terminal 212. The capacitance of the capacitor CC21 is determined in accordance with the distance between the transmission terminal 211 and the shield conductor 103, a width by which the transmission terminal 211 and the shield conductor 103 face each other, and the dielectric constant of the mold resin 102. The capacitance of the capacitor CC22 is similarly determined in accordance with the distance between the receiving terminal 212 and the shield conductor 103, a width by which the receiving terminal 212 and the shield conductor 103 face each other, and the dielectric constant of the mold resin 102.

With this configuration, the first signal StxL is cancelled out by the second signal StxC1. This improves the isolation between the transmission terminal 211 and the receiving terminal 212.

It is preferable that the phase $\theta_{StxL}$ of the first signal StxL and the phase $\theta_{StxC1}$ of the second signal StxC1 be opposite to each other. However, if the phase difference is preferably, for example, greater than about 90° and less than or equal to about 180°, the first signal StxL is reduced or prevented by a predetermined amount by the second signal StxC1. Also in this case, the isolation between the transmission terminal 211 and the receiving terminal 212 is improved.

It is further preferable that an absolute value ABS ($A_{StxL}$ (212)) of an amplitude of the first signal StxL and an absolute value ABS ($A_{StxC1}$ (212)) of an amplitude of the second signal StxC1 be the same or substantially the same at the receiving terminal 212. As a result, the first signal StxL is more effectively reduced or prevented by the second signal StxC1.

Thus, the high-frequency module 10 causes the transmission terminal 211 and the receiving terminal 212 of the branching circuit element 20 to be capacitively coupled to the shield conductor 103. The capacitive coupling defines a second signal transmission path including the shield conductor 103. The high-frequency module 10 reduces or prevents the first signal transmitted from the transmission terminal 211 to the receiving terminal 212 using the second signal. As a result, the degree of isolation between the transmission terminal 211 and the receiving terminal 212 is high and improved.

Figure 4A:
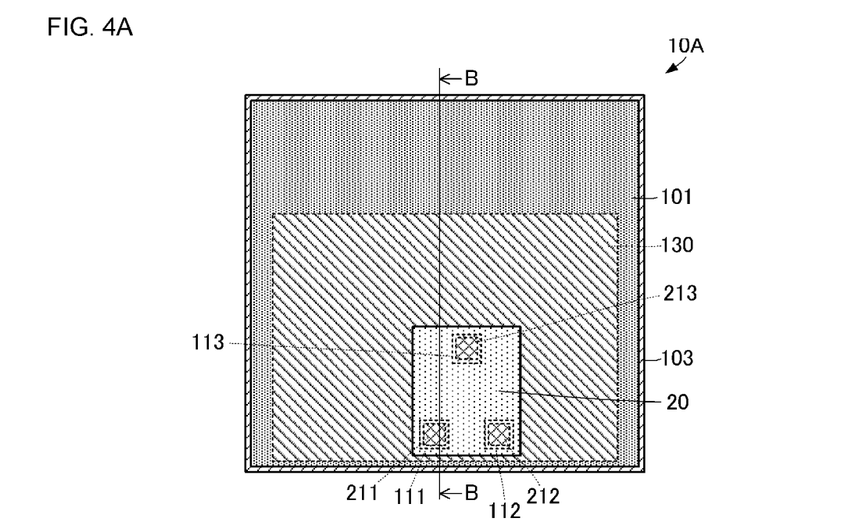
FIG. 4A is a plan view of a high-frequency module according to a second preferred embodiment of the present invention in a state in which the top surface portion of a shield conductor and a mold resin are not illustrated.
Figure 4B:
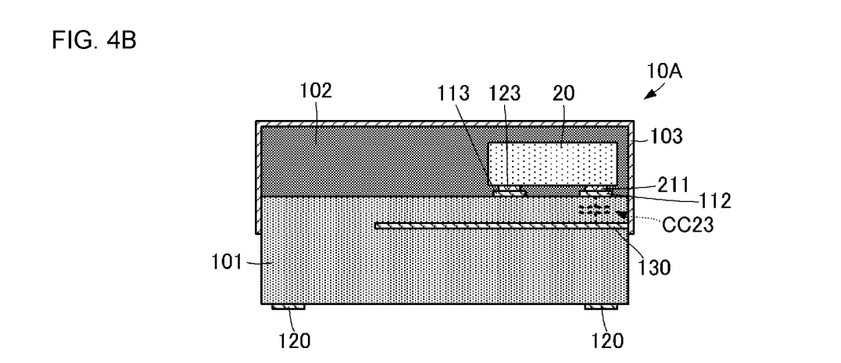
FIG. 4B is a side cross-sectional view of the high-frequency module according to the second preferred embodiment of the present invention illustrating the main configuration of the high-frequency module.
Figure 5:
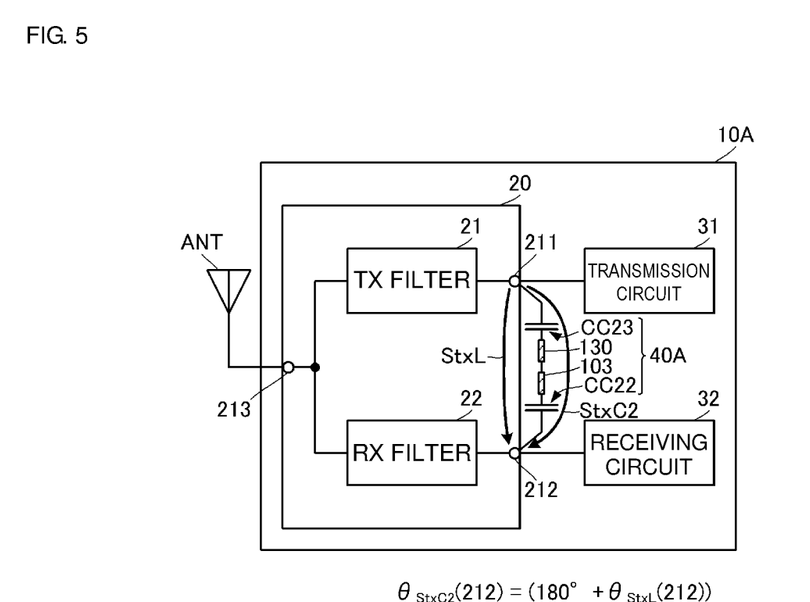
FIG. 5 is a circuit diagram of a high-frequency module according to the second preferred embodiment of the present invention.

Next, a high-frequency module according to a second preferred embodiment of the present invention will be described with reference to the accompanying drawings. FIG. 4A is a plan view of a high-frequency module according to the second preferred embodiment of the present invention illustrating the main configuration of the high-frequency module. FIG. 4A is a plan view of the high-frequency module in a state in which the top surface portion of a shield conductor and a mold resin are not illustrated. FIG. 4B is a side cross-sectional view of the high-frequency module according to the second preferred embodiment illustrating the main configuration of the high-frequency module. FIG. 4B is a cross-sectional view taken along a line B-B in FIG. 4A. FIG. 5 is a circuit diagram of a high-frequency module according to the second preferred embodiment of the present invention.

A high-frequency module 10A according to the present preferred embodiment differs from the high-frequency module 10 according to the first preferred embodiment in that it includes an internal ground conductor 130 as an internal conductive pattern. In addition, the high-frequency module 10A differs from the high-frequency module 10 according to the first preferred embodiment in that a by-pass circuit 40A is defined by the internal ground conductor 130. The other configuration of the high-frequency module 10A is the same or substantially the same as that of the high-frequency module 10 according to the first preferred embodiment, and the description thereof will be omitted. The internal ground conductor 130 corresponds to a "grounding conductive pattern".

As illustrated in FIGS. 4A and 4B, the internal ground conductor 130 is provided in the multilayer substrate 101. The internal ground conductor 130 overlaps the transmission terminal 211 in plan view of the high-frequency module 10A. The internal ground conductor 130 is connected to the shield conductor 103.

In this configuration, the transmission terminal 211 and the internal ground conductor 130 are capacitively coupled, so that a capacitor CC23 is defined. As a result, as illustrated in FIG. 5, the transmission terminal 211 and the receiving terminal 212 are connected by a by-pass circuit 40A that is defined by the series circuit including the capacitor CC23, the internal ground conductor 130, the shield conductor 103, and the capacitor CC22.

Even with this configuration, by appropriately determining the capacitances of the capacitors CC22 and CC23, the phase $\theta_{StxL}$ (212) of the first signal StxL and a phase $\theta_{StxC2}$ (212) of a second signal StxC2 are able to be opposite to each other ($\theta_{StxC2}$ (212)=(180°+$\theta_{StxL}$ (212)) at the receiving terminal 212. As a result, the isolation between the transmission terminal 211 and the receiving terminal 212 is improved. Also in this case, if the phase difference is greater than about 90° and less than or equal to about 180°, the first signal StxL is reduced or prevented by a predetermined amount by the second signal StxC2 and the isolation between the transmission terminal 211 and the receiving terminal 212 is improved.

Figure 6:
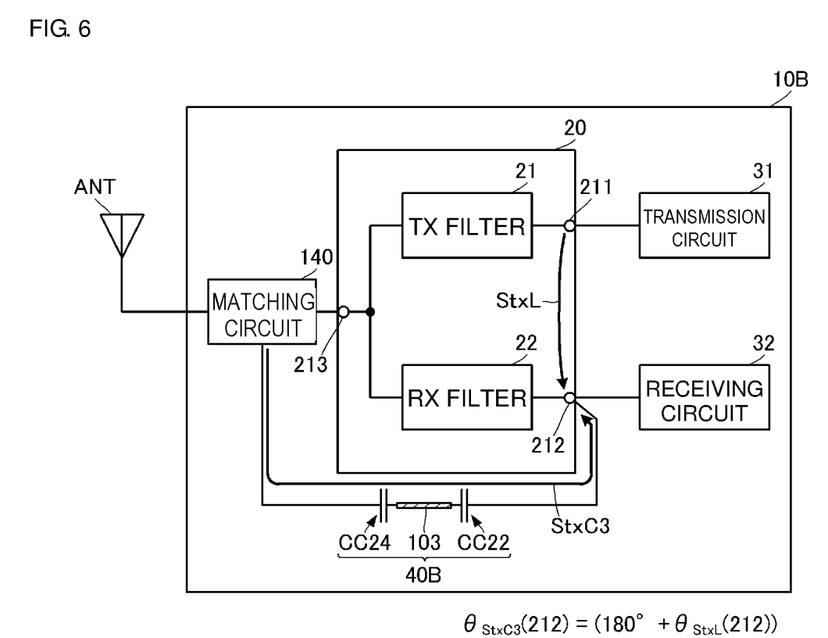
FIG. 6 is a circuit diagram of a high-frequency module according to a third preferred embodiment of the present invention.
Figure 7:
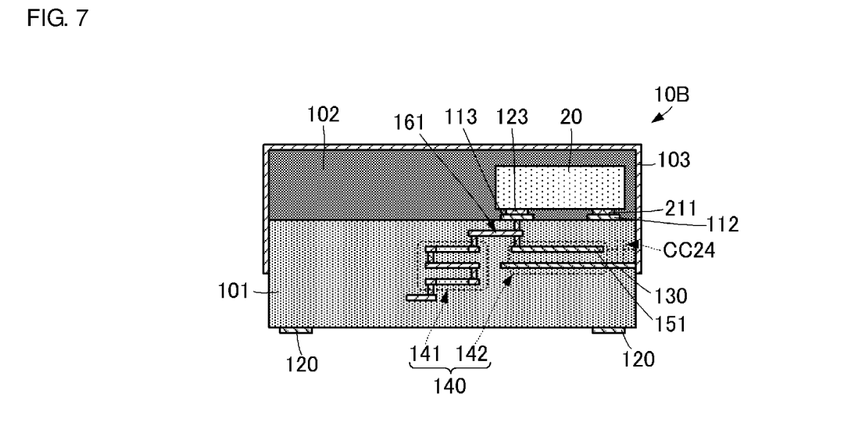
FIG. 7 is a side cross-sectional view of a high-frequency module according to the third preferred embodiment of the present invention illustrating the main configuration of the high-frequency module.

Next, a high-frequency module according to a third preferred embodiment of the present invention will be described with reference to the accompanying drawings. FIG. 6 is a circuit diagram of a high-frequency module according to the third preferred embodiment of the present invention. FIG. 7 is a side cross-sectional view of a high-frequency module according to the third preferred embodiment of the present invention illustrating the main configuration of the high-frequency module.

A high-frequency module 10B according to the present preferred embodiment differs from the high-frequency module 10A according to the second preferred embodiment in that it includes a matching circuit 140 and a by-pass circuit 40B includes the matching circuit 140. The remaining configuration of the high-frequency module 10B is the same or substantially the same as that of the high-frequency module 10A according to the second preferred embodiment, and the description thereof will be omitted.

As illustrated in FIG. 6, the high-frequency module 10B includes the matching circuit 140. The matching circuit 140 is connected between the common terminal 213 and the antenna ANT. The common terminal 213 corresponds to a "third mounting terminal".

As illustrated in FIG. 7, the matching circuit 140 includes an inductor 141 defined by an internal conductive pattern and a capacitor 142 defined by an internal conductive pattern. The inductor 141 and the capacitor 142 correspond to a "matching circuit element". The inductor 141 includes a linear conductor including an interlayer connection conductor having a winding structure. The capacitor 142 includes the internal ground conductor 130 and a planar conductor 151 that face each other. The inductor 141 and the capacitor 142 are connected to the land conductor 113 via a wiring conductive pattern 161.

The planar conductor 151 of the capacitor 142 is in the vicinity of the high-frequency module 103. The planar conductor 151 and the shield conductor 103 are, therefore, capacitively coupled, so that a capacitor CC24 is defined.

In this configuration, as illustrated in FIG. 6, the matching circuit 140 and the receiving terminal 212 are connected by the by-pass circuit 40B defined by a series circuit including the capacitor CC24, the shield conductor 103, and the capacitor CC22. A second signal StxC3 is transmitted to the by-pass circuit 40B.

Even with this configuration, by appropriately determining the capacitances of the capacitors CC22 and CC24, the phase $\theta_{StxL}$ (212) of the first signal StxL and a phase $\theta_{StxC3}$ (212) of the second signal StxC3 are able to be opposite to each other ($\theta_{StxC3}$ (212)=(180°+$\theta_{StxL}$ (212)) at the receiving terminal 212. As a result, the isolation between the transmission terminal 211 and the receiving terminal 212 is improved. Also in this case, if the phase difference is greater than about 90° and less than or equal to about 180°, the first signal StxL is reduced by a predetermined amount by the second signal StxC3 and the isolation between the transmission terminal 211 and the receiving terminal 212 is improved.

Figure 8A:
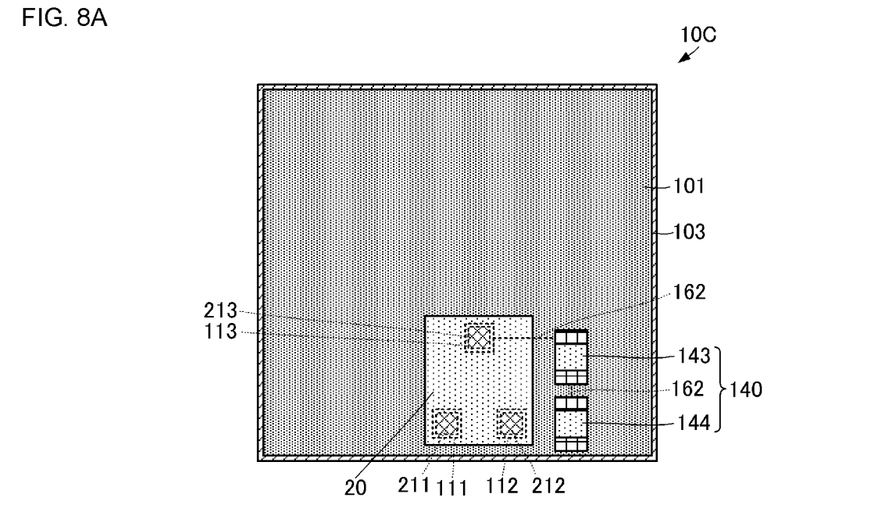
FIG. 8A is a plan cross-sectional view of a high-frequency module according to a fourth preferred embodiment of the present invention illustrating the main configuration of the high-frequency module.

Next, a high-frequency module according to a fourth preferred embodiment of the present invention will be described with reference to the accompanying drawings. FIG. 8A is a plan cross-sectional view of a high-frequency module according to the fourth preferred embodiment of the present invention illustrating the main configuration of the high-frequency module, and FIG. 8B is a partially enlarged view of the high-frequency module.

A high-frequency module 10C according to the present preferred embodiment differs from the high-frequency module 10B according to the third preferred embodiment in that the matching circuit 140 is a surface mount element. The remaining configuration of the high-frequency module 10C is the same or substantially the same as that of the high-frequency module 10B according to the third preferred embodiment, and the description thereof will be omitted.

As illustrated in FIG. 8A, the matching circuit 140 includes matching circuit elements 143 and 144 that are each surface mount elements. Both of the matching circuit elements 143 and 144 may be inductors or capacitors. Alternatively, one of the matching circuit elements 143 and 144 may be an inductor and the other one of them may be a capacitor. The matching circuit elements 143 and 144 are disposed on the surface of the multilayer substrate 101. The matching circuit elements 143 and 144 are connected to the common terminal 213 by a wiring conductor 162 formed at the multilayer substrate 101.

Figure 8B:
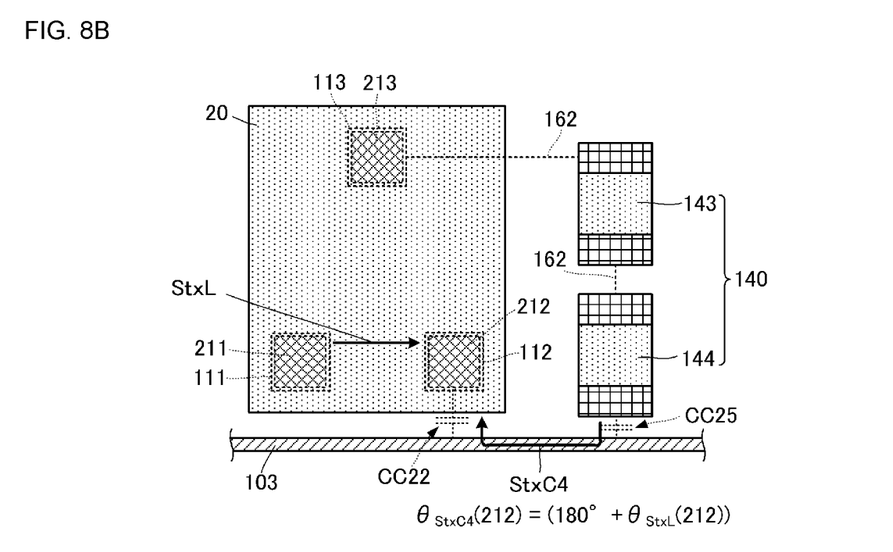
FIG. 8B is a partially enlarged view of the high-frequency module.

As illustrated in FIG. 8B, one external connection terminal of the matching circuit element 144 is in the vicinity of the shield conductor 103. The external connection terminal of the matching circuit element 144 and the shield conductor 103 are therefore capacitively coupled, so that a capacitor CC25 is defined.

In this configuration, the matching circuit 140 and the receiving terminal 212 are connected by a by-pass circuit defined by a series circuit including the capacitor CC25, the shield conductor 103, and the capacitor CC22. A second signal StxC4 is transmitted to this by-pass circuit.

Even with this configuration, by appropriately determining the capacitances of the capacitors CC22 and CC25, the phase $\theta_{StxL}$ (212) of the first signal StxL and a phase $\theta_{StxC4}$ (212) of the second signal StxC4 are able to be opposite to each other ($\theta_{StxC4}$ (212)=(180°+$\theta_{StxL}$ (212)) at the receiving terminal 212. As a result, the isolation between the transmission terminal 211 and the receiving terminal 212 is improved. Also in this case, if the phase difference is greater than about 90° and less than or equal to about 180°, the first signal StxL is reduced by a predetermined amount by the second signal StxC4 and the isolation between the transmission terminal 211 and the receiving terminal 212 is improved.

Figure 9:
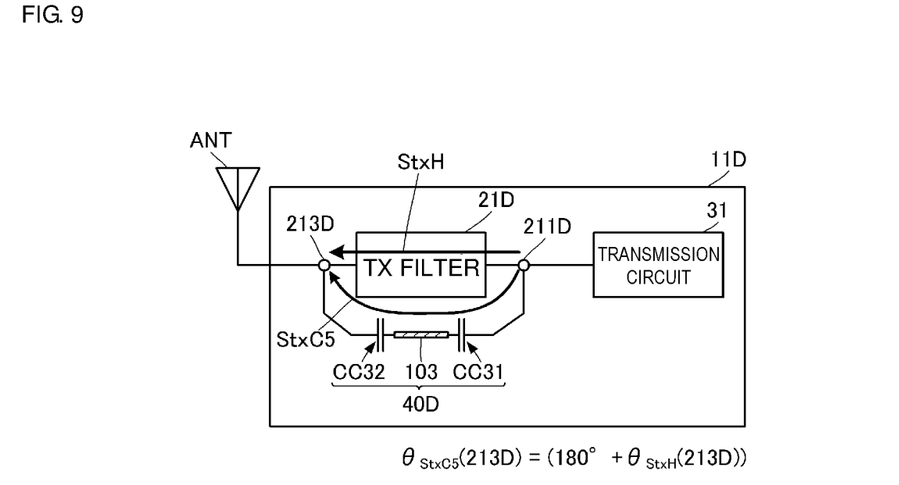
FIG. 9 is a circuit diagram of a high-frequency module according to a fifth preferred embodiment of the present invention.
Figure 10:
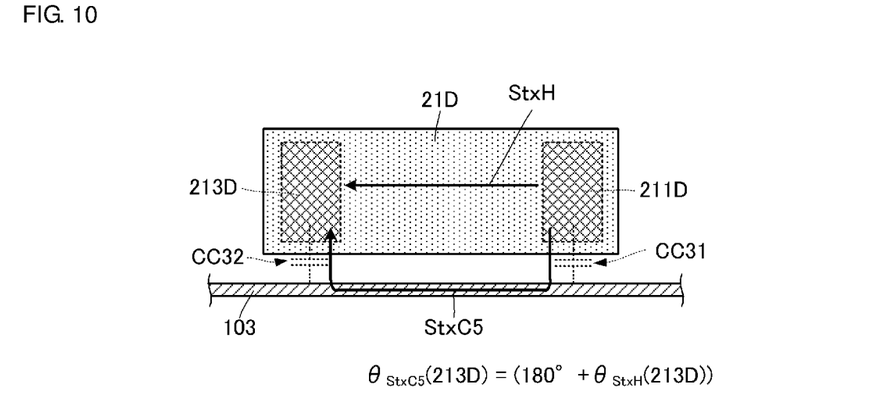
FIG. 10 is an enlarged view of a portion of a high-frequency module according to a preferred embodiment of the present invention in which a filter circuit element is disposed.

Next, a high-frequency module according to a fifth preferred embodiment of the present invention will be described with reference to the accompanying drawings. FIG. 9 is a circuit diagram of a high-frequency module according to the fifth preferred embodiment of the present invention. FIG. 10 is an enlarged view of a portion of a high-frequency module in which a filter circuit element is disposed.

A high-frequency module 11D according to the present preferred embodiment differs from the high-frequency module 10 according to the first preferred embodiment in that it includes a TX filter element 21D and the transmission circuit 31 and does not include an RX filter receiving circuit. The transmission circuit is the same or substantially the same as the transmission circuit 31 in the high-frequency module 10 according to the first preferred embodiment. The TX filter element 21D is obtained by replacing the TX filter 21 in the branching circuit element 20 in the high-frequency module 10 according to the first preferred embodiment with a single surface mount element.

The TX filter element 21D includes a transmission terminal 211D and an antenna terminal 213D. The transmission terminal 211D is connected to the transmission circuit 31. The antenna terminal 213D is connected to the antenna ANT. The antenna terminal 213D corresponds to the "first mounting terminal". The transmission terminal 211D corresponds to the "second mounting terminal".

As illustrated in FIG. 10, the TX filter element 21D is disposed on the surface of the multilayer substrate 101 such that a direction in which the transmission terminal 211D and the antenna terminal 213D are arranged and the first side surface portion of the shield conductor 103 are preferably parallel or substantially parallel to each other. The transmission terminal 211D and the antenna terminal 213D are in the vicinity of the shield conductor 103. In this configuration, the transmission terminal 211D and the shield conductor 103 are capacitively coupled, so that a capacitor CC31 is defined. The antenna terminal 213D and the shield conductor 103 are capacitively coupled, so that a capacitor CC32 is defined.

The transmission terminal 211D and the antenna terminal 213D are connected by a by-pass circuit 40D defined by a series circuit including the capacitor CC31, the shield conductor 103, and the capacitor CC32. A second signal StxC5 is transmitted to the by-pass circuit 40D.

Even with this configuration, by appropriately determining the capacitances of the capacitors CC31 and CC32, a phase $\theta_{StxH}$ (213D) of a signal StxH in the unnecessary frequency band of the first signal and a phase $\theta_{StxC5}$ (213D) of the second signal StxC5 are able to be opposite to each other ($\theta_{StxC3}$ (213D)=(180°+$\theta_{StxH}$ (213D))) at the antenna terminal 213D. The signal StxH in the unnecessary frequency band of the first signal is, for example, a harmonic signal of a transmission signal, and is transmitted from the transmission terminal 211D to the antenna terminal 213D via the TX filter element 21D. The second signal StxC5 is a harmonic signal of the transmission signal which is transmitted through the by-pass circuit 40D.

As a result, the isolation between the transmission terminal 211D and the antenna terminal 213D is improved for the harmonic signal of the transmission signal. Also in this case, if the phase difference is greater than about 90° and less than or equal to about 180°, the signal StxH in the unnecessary frequency band of the first signal is reduced by a predetermined amount by the second signal StxC5 and the isolation between the transmission terminal 211D and the antenna terminal 213D is improved.

Thus, a configuration according to preferred embodiments of the present invention contribute not only to the improvement of isolation between a transmission terminal and a receiving terminal in a branching circuit but also to the improvement of isolation between a plurality of mounting terminals in a circuit element, such as a filter circuit.

Figure 11:
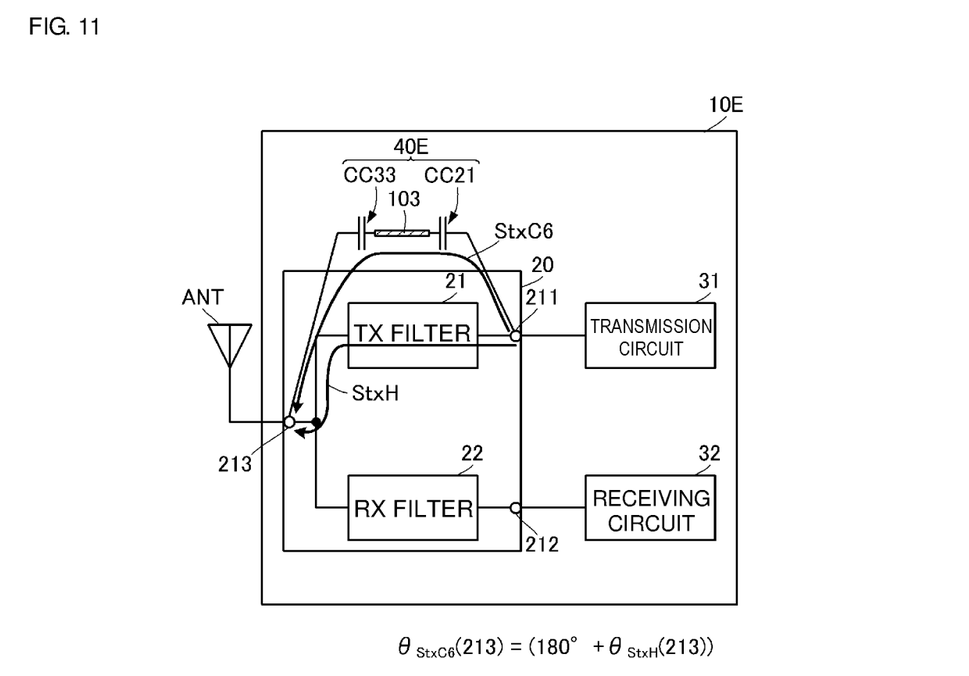
FIG. 11 is a circuit diagram of a high-frequency module according to a sixth preferred embodiment of the present invention.
Figure 12:
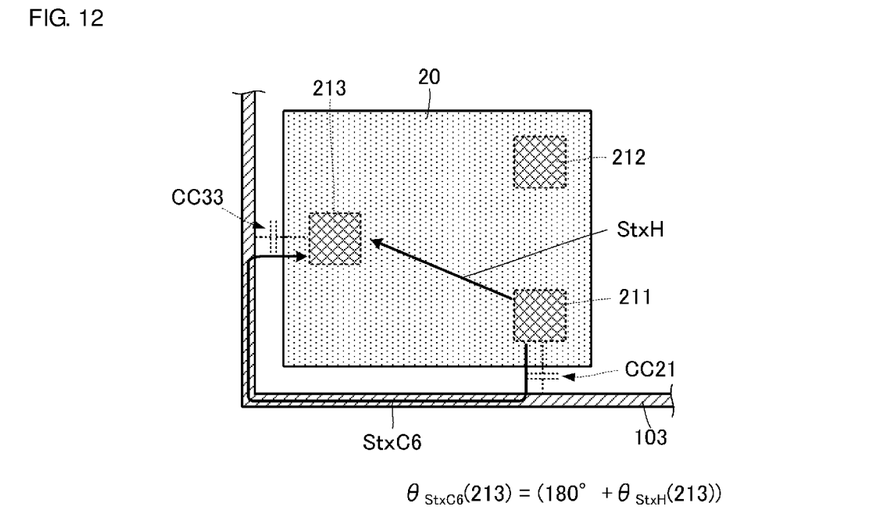
FIG. 12 is an enlarged view of a portion of a high-frequency module according to a preferred embodiment of the present invention in which a branching circuit element is disposed.

Next, a high-frequency module according to a sixth preferred embodiment of the present invention will be described with reference to the accompanying drawings. FIG. 11 is a circuit diagram of a high-frequency module according to the sixth preferred embodiment of the present invention. FIG. 12 is an enlarged view of a portion of the high-frequency module in which a branching circuit element is disposed.

A high-frequency module 10E according to this preferred embodiment is obtained by applying the concept of the high-frequency module 10D according to the fifth preferred embodiment to the high-frequency module 10 according to the first preferred embodiment.

In the high-frequency module 10E, the transmission terminal 211 and the common terminal 213 are connected by the TX filter 21 and a by-pass circuit 40E.

As illustrated in FIG. 12, the by-pass circuit 40E is obtained by mounting the branching circuit element 20 on the multilayer substrate 101. In the branching circuit element 20, the transmission terminal 211 and the common terminal 213 is disposed in the vicinity of the shield conductor 103. The transmission terminal 211 and the shield conductor 103 are therefore capacitively coupled, so that the capacitor CC21 is defined. The common terminal 213 and the shield conductor 103 are capacitively coupled, so that a capacitor CC33 is defined. The by-pass circuit 40E is defined by a series circuit including the capacitor CC21, the shield conductor 103, and the capacitor CC33.

Even with this configuration, by appropriately determining the capacitances of the capacitors CC21 and CC33, the phase $\theta_{StxH}$ (213) of the signal StxH in the unnecessary frequency band of the first signal and a phase $\theta_{StxC6}$ (213) of a second signal StxC6 passing through the by-pass circuit 40E are able to be opposite to each other ($\theta_{StxC6}$ (213)= (180°+$\theta_{StxH}$ (213))) at the common terminal 213.

As a result, the isolation between the transmission terminal 211 and the common terminal 213 is improved for the harmonic signal of a transmission signal. Also in this case, if the phase difference is greater than about 90° and less than or equal to about 180°, the signal StxH in the unnecessary frequency band of the first signal is reduced by a predetermined amount by the second signal StxC6 and the isolation between the transmission terminal 211 and the common terminal 213 can be improved.

The above-described preferred embodiments of the preset invention may be combined. As a result, the isolation between a mounting terminal into which a transmission signal is input and the other mounting terminals is improved.

In the configuration of each of the above-described preferred embodiments of the present invention, a conductor non-formation portion may be provided in the shield conductor 103.

Figure 13A:
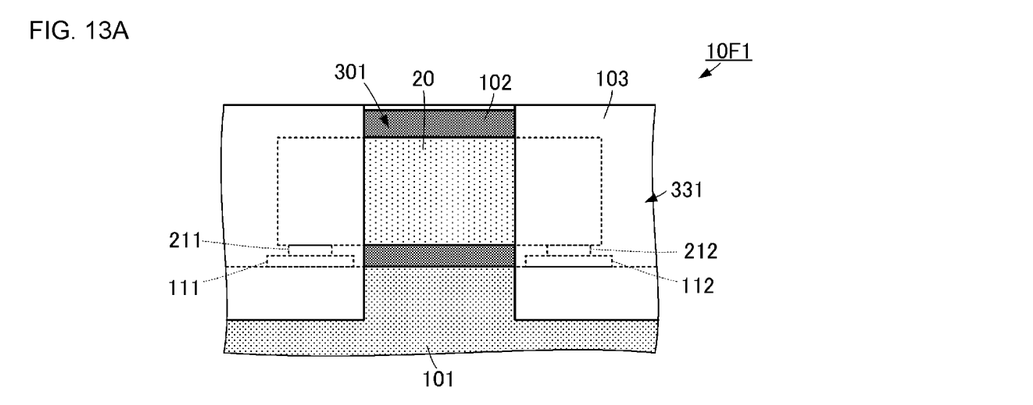
FIGS. 13A to 13C are side views of parts of a high-frequency module according to a preferred embodiment of the present invention including a shield conductor that includes a conductor non-formation portion.
Figure 13B:
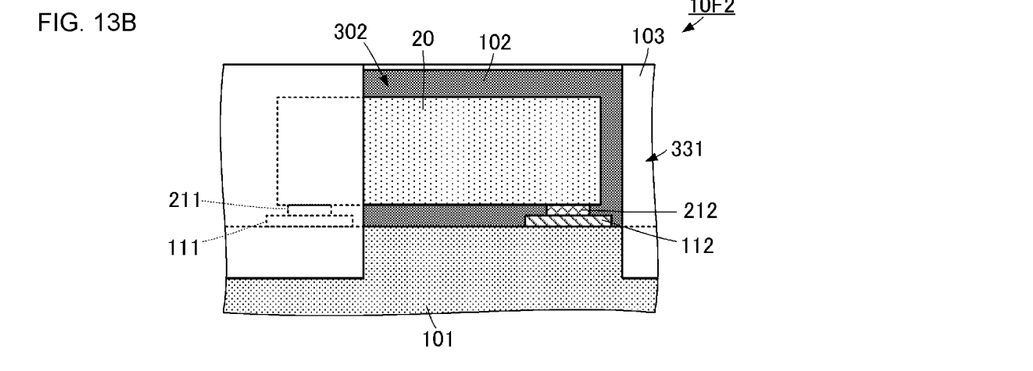
Figure 13C:
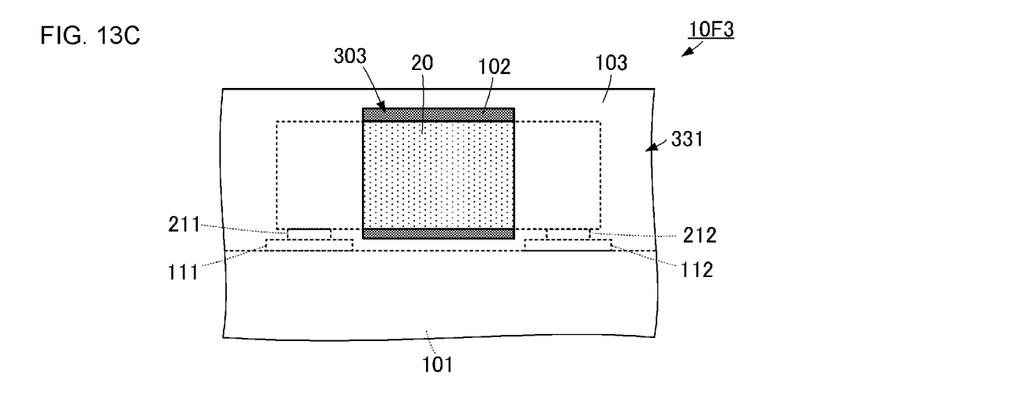

FIGS. 13A to 13C are side views of portions of a high-frequency module including a shield conductor that includes a conductor non-formation portion. The shapes of the conductor non-formation portions in FIGS. 13A to 13C differ from one another.

In a high-frequency module 10F1 illustrated in FIG. 13A, the shield conductor 103 includes a conductor non-formation portion 301. The conductor non-formation portion 301 is provided in a first side surface portion 331. The first side surface portion 331 is one of the four side surface portions of the shield conductor 103 which is nearest to the transmission terminal 211 and the receiving terminal 212 in the branching circuit element 20. The conductor non-formation portion 301 extends from the end portion of the first side surface portion 331 on the side of the top surface portion of the shield conductor 103 to an opposing end portion (a distal end portion). The length of the first side surface portion 331 in which the conductor non-formation portion 301 is provided is preferably shorter than the distance between the transmission terminal 211 and the receiving terminal 212 in the branching circuit element 20. That is, the length of the first side surface portion 331 in which the conductor non-formation portion 301 is provided is preferably shorter than the length of the branching circuit element 20 in a direction parallel or substantially parallel to the first side surface portion 331. The length of the first side surface portion 331 in which the conductor non-formation portion 301 is provided is a length parallel or substantially parallel to the top surface portion of the shield conductor 103. The conductor non-formation portion 301 is provided such that the transmission terminal 211 and the receiving terminal 212 overlap the shield conductor 103 in side view of the high-frequency module 10F1 (when the high-frequency module 10F1 is viewed from the first side surface portion 331).

That is, the one of the side surfaces of the branching circuit element 20 which is close to the transmission terminal 211 and the receiving terminal 212 includes an overlapping portion that overlaps the first side surface portion 331 of the shield conductor 103 and a non-overlapping portion that does not overlap the conductor formation portion of the first side surface portion 331 (that overlaps the conductor non-formation portion 301 of the shield conductor 103) in side view of the high-frequency module 10F1. The overlapping portion includes a first overlapping portion on the side of the transmission terminal 211 and a second overlapping portion on the side of the receiving terminal 212. The first and second overlapping portions are separated from each other by the non-overlapping portion.

In this configuration, between the first and second overlapping portions, a capacitor is defined. An additional capacitor is able to therefore be connected in series to the shield conductor 103 in the by-pass circuit. As a result, the phase of the second signal is able to be further adjusted and isolation is able to be improved with more certainty.

In the configuration illustrated in FIG. 13A in particular, the transmission terminal 211 and the receiving terminal 212 are in the vicinity of the shield conductor 103 (the conductor formation portion of the shield conductor 103). Accordingly, both of the transmission terminal 211 and the receiving terminal 212 capacitively coupled to the shield conductor 103 define capacitors having capacitances larger than or equal to a predetermined capacitance.

A high-frequency module 10F2 illustrated in FIG. 13B differs from the high-frequency module 10F1 illustrated in FIG. 13A in the shape of a conductor non-formation portion 302. The conductor non-formation portion 302 overlaps the receiving terminal 212 in side view of the high-frequency module 10F2. That is, in the high-frequency module 10F2, the shield conductor 103 does not overlap the receiving terminal 212.

Even with this configuration, an additional capacitor is able to be connected in series to the shield conductor 103 in the by-pass circuit.

A high-frequency module 10F3 illustrated in FIG. 13C differs from the high-frequency module 10F1 illustrated in FIG. 13A in the shape of a conductor non-formation portion 303. The conductor non-formation portion 303 does not extend to the end portion of the first side surface portion 331 of the shield conductor 103 on the side of the top surface and the distal end portion of the first side surface portion 331.

Even with this configuration, an additional capacitor is able to be connected in series to the shield conductor 103 in the by-pass circuit.

In a high-frequency module according to a preferred embodiment of the present invention, the conductor non-formation portion of the shield conductor 103 does not necessarily have to have the shape illustrated in FIGS. 13A to 13C. Specifically, a conductor non-formation portion is provided such that at least one of a plurality of terminals of a surface mount element (for example, the branching circuit element 20) which are capacitively coupled to the shield conductor 103 and the conductor formation portion of the shield conductor 103 overlap in side view of a high-frequency module.

The mold resin 102 in the above-described preferred embodiments of the present invention does not necessarily have to be provided. However, the mold resin 102 increases the degree of capacitive coupling between a mounting terminal and a shield conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a surface mount element including a first mounting terminal and a second mounting terminal;
   a multilayer substrate at which the surface mount element is disposed; and
   a shield conductor that is disposed on a side of a surface of the multilayer substrate, covers the surface mount element, and is spaced apart from the surface mount element; wherein
   when a high-frequency signal that passes through between the second mounting terminal and the first mounting terminal is defined as a first signal and a high-frequency signal that transmits from the second mounting terminal to the first mounting terminal via the shield conductor is defined as a second signal, the first mounting terminal and the second mounting terminal are disposed with respect to the shield conductor such that a signal in at least a portion of a frequency band of the first signal is canceled by the second signal at the first mounting terminal.

2. The high-frequency module according to claim 1, wherein, when a phase of a signal in at least a portion of the frequency band of the first signal is defined as $\theta_{StxL}$ and a phase of the second signal is defined as $\theta_{StxC1}$, the first mounting terminal and the second mounting terminal are disposed with respect to the shield conductor such that a difference of the phases is greater than about 90° and less than or equal to about 180°.

3. The high-frequency module according to claim 1, wherein the first mounting terminal and the second mounting terminal are capacitively coupled to the shield conductor.

4. The high-frequency module according to claim 1, wherein
the multilayer substrate includes a first internal conductive pattern connected to the shield conductor;
the first mounting terminal is capacitively coupled to the shield conductor; and
the second mounting terminal is capacitively coupled to the first internal conductive pattern.

5. The high-frequency module according to claim 4, wherein the first internal conductive pattern is a grounding conductive pattern.

6. The high-frequency module according to claim 1, wherein
the surface mount element is a branching circuit element including a transmission terminal, a receiving terminal, and a common terminal;
the second mounting terminal defining the transmission terminal; and
the first mounting terminal defining the receiving terminal.

7. The high-frequency module according to claim 6, wherein
the surface mount element includes a third mounting terminal defining the common terminal;
the surface mount element is disposed on a surface of the multilayer substrate via the third mounting terminal;
the multilayer substrate includes a matching circuit element connected to the third mounting terminal; and
the first mounting terminal and the matching circuit element are capacitively coupled to the shield conductor.

8. The high-frequency module according to claim 1, further comprising a mold resin that covers an entire or substantially an entire surface of the multilayer substrate.

9. The high-frequency module according to claim 8, wherein a top surface portion of the shield conductor covers a top surface of the mold resin, and four side surface portions of the shield conductor respectively cover four side surfaces of the mold resin.

10. The high-frequency module according to claim 9, wherein each of the four side surface portions of the shield conductor also covers a portion of a corresponding one of four side surfaces of the multilayer substrate.

11. A high-frequency module comprising:
a surface mount element including a transmission terminal, a receiving terminal, and a common terminal;
a multilayer substrate at which the surface mount element is disposed; and
a shield conductor that is disposed on a side of a surface of the multilayer substrate, covers the surface mount element, and is spaced apart from the surface mount element; wherein
the multilayer substrate includes a matching circuit element connected to the common terminal;
a high-frequency signal that is leaked from the transmission terminal to the receiving terminal is defined as a first signal and a high-frequency signal that transmits from the common terminal to the receiving terminal via the matching circuit element and the shield conductor is defined as a second signal; and
the receiving terminal and the matching circuit element are disposed with respect to the shield conductor such that a signal in at least a portion of a frequency band of the first signal is cancelled by the second signal at the receiving terminal.

12. The high-frequency module according to claim 11, wherein, when a phase of a signal in at least a portion of the frequency band of the first signal is defined as $\theta_{StxL}$ and a phase of the second signal is defined as $\theta_{StxC1}$, the first mounting terminal and the second mounting terminal are disposed with respect to the shield conductor such that a difference of the phases is greater than about 90° and less than or equal to about 180°.

13. The high-frequency module according to claim 11, wherein the receiving terminal and the matching circuit element are capacitively coupled to the shield conductor.

14. The high-frequency module according to claim 9, wherein the matching circuit element is provided in the multilayer substrate.

15. The high-frequency module according to claim 10, wherein the matching circuit element is disposed on a surface of the multilayer substrate.

16. The high-frequency module according to claim 1, wherein
one of side surfaces of the surface mount element which is nearest to the shield conductor is defined as a first side surface; and
the high-frequency module includes an overlapping portion in which the first side surface and the shield conductor overlap and a non-overlapping portion in which the first side surface and the shield conductor do not overlap when viewed from the first side surface.

17. The high-frequency module according to claim 16, wherein
when viewed from a front, the overlapping portion includes a first overlapping portion and a second overlapping portion that are separated from each other by the non-overlapping portion; and
when viewed from the front, a length between the first overlapping portion and the second overlapping portion is shorter than a length of the first side surface.

18. The high-frequency module according to claim 11, further comprising a mold resin that covers an entire or substantially an entire surface of the multilayer substrate.

19. The high-frequency module according to claim 18, wherein a top surface portion of the shield conductor covers a top surface of the mold resin, and four side surface portions of the shield conductor respectively cover four side surfaces of the mold resin.

20. The high-frequency module according to claim 19, wherein each of the four side surface portions of the shield conductor also covers a portion of a corresponding one of four side surfaces of the multilayer substrate.

* * * * *